US012332042B2

United States Patent
Wong et al.

(10) Patent No.: US 12,332,042 B2
(45) Date of Patent: Jun. 17, 2025

(54) IN-SITU WAFER THICKNESS AND GAP MONITORING USING THROUGH BEAM LASER SENSOR

(71) Applicant: LAM RESEARCH CORPORATION, Fremont, CA (US)

(72) Inventors: Goon Heng Wong, Pleasanton, CA (US); Xuefeng Hua, Foster City, CA (US); Anthony Paul Van Selow, Santa Clara, CA (US); Daniel Torres, San Jose, CA (US); Jack Chen, San Francisco, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/913,902

(22) PCT Filed: Mar. 24, 2021

(86) PCT No.: PCT/US2021/023852
§ 371 (c)(1),
(2) Date: Sep. 23, 2022

(87) PCT Pub. No.: WO2021/195190
PCT Pub. Date: Sep. 30, 2021

(65) Prior Publication Data
US 2024/0210163 A1    Jun. 27, 2024

Related U.S. Application Data

(60) Provisional application No. 63/001,145, filed on Mar. 27, 2020.

(51) Int. Cl.
*G01B 11/06* (2006.01)
*C23C 14/54* (2006.01)
(Continued)

(52) U.S. Cl.
CPC ........ *G01B 11/0683* (2013.01); *C23C 14/547* (2013.01); *C23C 16/52* (2013.01); *G01B 11/0625* (2013.01); *G01B 11/14* (2013.01)

(58) Field of Classification Search
CPC . G01B 11/0683; G01B 11/0625; G01B 11/14; G01B 11/06; G01B 2210/56;
(Continued)

(56) References Cited

U.S. PATENT DOCUMENTS 7,936,464 B2    5/2011    Keranen
2006/0062897 A1    3/2006    Gu et al.
(Continued)

FOREIGN PATENT DOCUMENTS

CN    113035677 A    6/2021
JP    S57080508 A    5/1982
(Continued)

OTHER PUBLICATIONS

International Search Report and Written Opinion of the ISA issued in PCT/US2021/023852 mailed Jul. 13, 2021; ISA/KR.
(Continued)

*Primary Examiner* — Md M Rahman (57) ABSTRACT

A system for determining a thickness of a substrate arranged in a processing chamber includes an emitter configured to transmit a signal toward a gap between the substrate and a component of the processing chamber arranged above the substrate, a receiver configured to receive at least a portion of the transmitted signal and generate a measurement signal based on a characteristic of the received portion of the signal, and a system controller configured to receive the measurement signal and selectively adjust a parameter of the processing chamber based on a relationship between values of the measurement signal and at least one of the thickness of the substrate, a width of the gap between the substrate and
(Continued)

the component of the processing chamber, and an amount to adjust the parameter of the processing chamber.

41 Claims, 5 Drawing Sheets

(51) Int. Cl.
  *C23C 16/52* (2006.01)
  *G01B 11/14* (2006.01)
(58) Field of Classification Search
  CPC ....... C23C 14/547; C23C 16/52; H01L 22/12; H01L 21/67253
  USPC ......................................................... 356/630
  See application file for complete search history.

(56) References Cited

U.S. PATENT DOCUMENTS

| 2007/0127035 | A1* | 6/2007 | Demarest ........... G01B 9/02007 356/498 |
| 2007/0215043 | A1 | 9/2007 | Yamazawa et al. |
| 2008/0293248 | A1 | 11/2008 | Park et al. |
| 2011/0049100 | A1 | 3/2011 | Han et al. |
| 2011/0308453 | A1 | 12/2011 | Su et al. |
| 2013/0155390 | A1 | 6/2013 | Jensen et al. |
| 2016/0215396 | A1 | 7/2016 | Khandelwal et al. |
| 2017/0350688 | A1 | 12/2017 | Boyd, Jr. et al. |
| 2019/0058098 | A1 | 2/2019 | Grubisik et al. |
| 2020/0217657 | A1 | 7/2020 | Emerson et al. |

FOREIGN PATENT DOCUMENTS

| JP | H0452288 A | 2/1992 |
| JP | H09104985 A | 4/1997 |
| JP | 2000205832 A | 7/2000 |
| JP | 2016148107 A | 8/2016 |
| KR | 20060060997 A | 6/2006 |
| TW | 200514145 A | 4/2005 |
| WO | WO-2021195190 A1 | 9/2021 |

OTHER PUBLICATIONS

International Search Report and Written Opinion issued in related PCT Application PCT/US2023/019064 mailed Aug. 9, 2023 (ISA/KR).
Office Action in Corresponding Taiwanese Application No. 110111015 dated Nov. 25, 2024.
Office Action in Corresponding Japanese Application No. 2022558048 dated Jan. 7, 2025.

* cited by examiner

IN-SITU WAFER THICKNESS AND GAP MONITORING USING THROUGH BEAM LASER SENSOR

CROSS-REFERENCE TO RELATED APPLICATIONS

This application is a U.S. National Phase Application under 35 U.S.C. 371 of International Application PCT/US2021/023852, filed on Mar. 24, 2021, which claims the benefit of U.S. Provisional Application No. 63/001,145, filed on Mar. 27, 2020. The entire disclosures of the application referenced above are incorporated herein by reference.

FIELD

The present disclosure relates to substrate processing, and more particularly to monitoring substrate thickness and processing chamber parameters.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, rapid thermal processing (RTP), ion implant, physical vapor deposition (PVD), and/or other etch, deposition, or cleaning processes. A substrate may be arranged on a substrate support, such as a pedestal, an electrostatic chuck (ESC), etc. in a processing chamber of the substrate processing system. During processing, gas mixtures including one or more precursors may be introduced into the processing chamber and plasma may be used to initiate chemical reactions.

SUMMARY

A system for determining a thickness of a substrate arranged in a processing chamber includes an emitter configured to transmit a signal toward a gap between the substrate and a component of the processing chamber arranged above the substrate, a receiver configured to receive at least a portion of the transmitted signal and generate a measurement signal based on a characteristic of the received portion of the signal, and a system controller configured to receive the measurement signal and selectively adjust a parameter of the processing chamber based on a relationship between values of the measurement signal and at least one of the thickness of the substrate, a width of the gap between the substrate and the component of the processing chamber, and an amount to adjust the parameter of the processing chamber.

In other features, the transmitted signal is a laser and the characteristic is a beam intensity of the laser. The emitter and the receiver are arranged on opposite sidewalls of the processing chamber and the beam intensity of the laser corresponds to a portion of the laser that passes through the gap to be received by the receiver. A combination emitter/receiver comprises the emitter and the receiver and the beam intensity of the laser corresponds to a portion of the laser reflected off of at least one of the substrate and the component and back toward the emitter/receiver. The values of the measurement signal include one of voltage values and current values indicative of the beam intensity.

In other features, the system controller is configured to calculate at least one of the thickness of the substrate and the width of the gap based on the values of the measurement signal. The system controller is configured to calculate the amount to adjust the parameter based on the at least one of the thickness of the substrate and the width of the gap. The system controller is configured to determine at least one of the thickness of the substrate and the width of the gap based on stored data correlating the values of the measurement signal to the at least one of the thickness of the substrate and the width of the gap.

In other features, the system controller is configured to determine the amount to adjust the parameter based on stored data correlating the values of the measurement signal to the amount to adjust the parameter. The parameter corresponds to at least one of a deposition rate and an etch rate and the system controller is configured to adjust the at least one of the deposition rate and the etch rate based on the values of the measurement signal.

A method for determining a thickness of a substrate arranged in a processing chamber includes transmitting, using an emitter, a signal toward a gap between the substrate and a component of the processing chamber arranged above the substrate, receiving, using a receiver, at least a portion of the transmitted signal and generating a measurement signal based on a characteristic of the received portion of the signal, and selectively adjusting a parameter of the processing chamber based on a relationship between values of the measurement signal and at least one of the thickness of the substrate, a width of the gap between the substrate and the component of the processing chamber, and an amount to adjust the parameter of the processing chamber.

In other features, the transmitted signal is a laser and the characteristic is a beam intensity of the laser. The emitter and the receiver are arranged on opposite sidewalls of the processing chamber and the beam intensity of the laser corresponds to a portion of the laser that passes through the gap to be received by the receiver. A combination emitter/receiver comprises the emitter and the receiver and the beam intensity of the laser corresponds to a portion of the laser reflected off of at least one of the substrate and the component and back toward the emitter/receiver. The values of the measurement signal include one of voltage values and current values indicative of the beam intensity.

In other features, the method further includes calculating at least one of the thickness of the substrate and the width of the gap based on the values of the measurement signal. The method further includes calculating the amount to adjust the parameter based on the at least one of the thickness of the substrate and the width of the gap. The method further includes determining at least one of the thickness of the substrate and the width of the gap based on stored data correlating the values of the measurement signal to the at least one of the thickness of the substrate and the width of the gap.

In other features, the method further includes determining the amount to adjust the parameter based on stored data correlating the values of the measurement signal to the amount to adjust the parameter. The parameter corresponds to at least one of a deposition rate and an etch rate and further comprising adjusting the at least one of the deposition rate and the etch rate based on the values of the measurement signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

As the complexity of substrate processing increases due to technologies such as bonded wafers, 3D stacking, 3D NAND memory, etc., substrate thickness variation (i.e., substrate-to-substrate variation) also increases. Some processes have a high sensitivity to substrate thickness and an effective gap between the substrate and a gas distribution device (e.g., a showerhead) arranged above the substrate in a substrate processing chamber. Accordingly, variations in the substrate thickness may cause process non-uniformities and changes to both process behavior and results. Further, components of the processing chamber (e.g., the gas distribution device, a substrate support, etc.) may have an associated manufacturing tolerance that causes variations in the effective gap.

Systems and methods according to the present disclosure implement a laser or other signal and a sensor to measure the substrate thickness and/or the effective gap between the substrate and the gas distribution device. For example, one or more characteristics of the laser (e.g., a beam intensity) may be proportional to the gap and/or the substrate thickness. Accordingly, process parameters may be adjusted to compensate for any variations in the substrate thickness or the effective gap.

Figure 1:
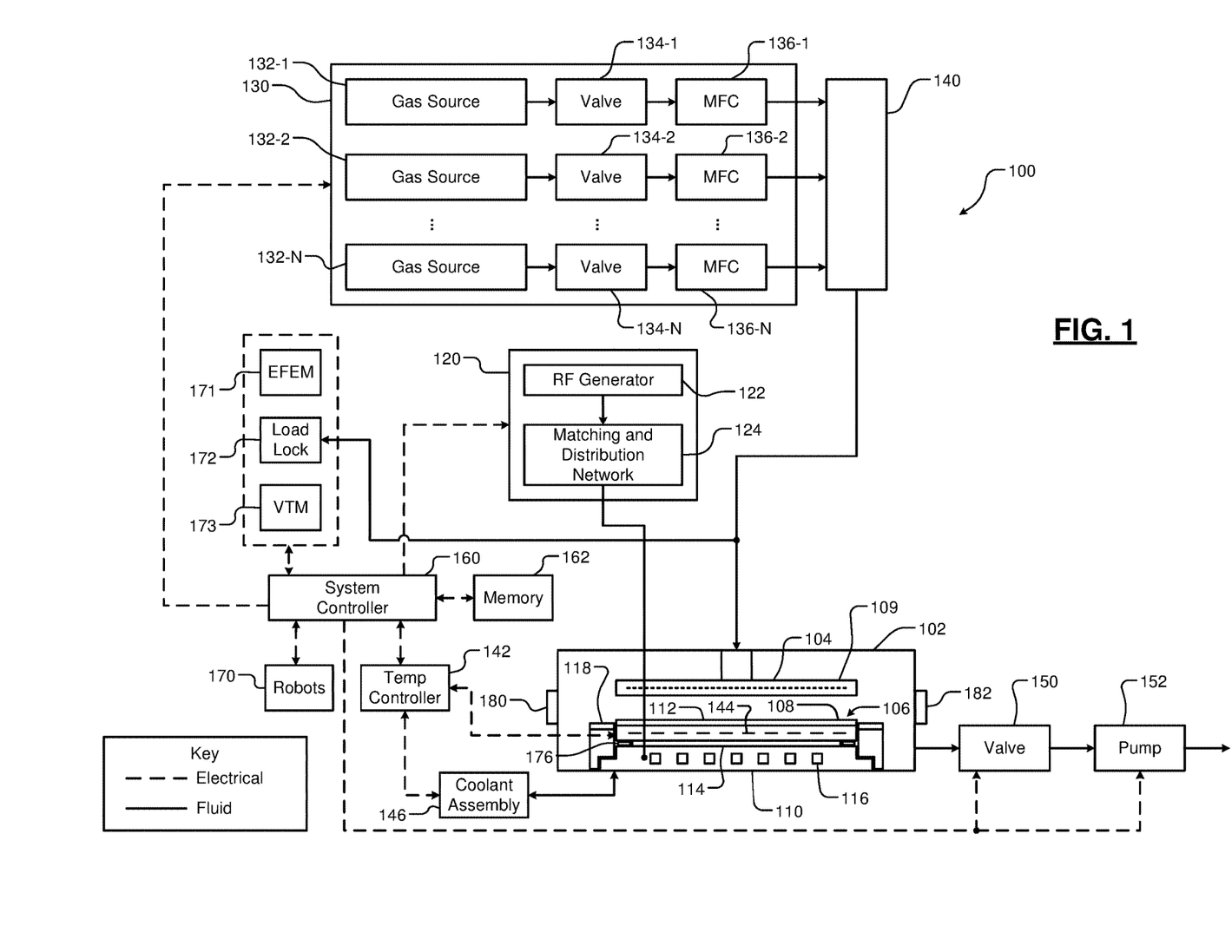
FIG. 1 is a functional block diagram of an example substrate processing system including a substrate support according to the present disclosure.

FIG. 1 shows a substrate processing system 100 including a processing chamber 102 that encloses components of the substrate processing system 100 and contains RF plasma. The processing chamber 102 includes an upper electrode 104 and a substrate support 106, which may be an electrostatic chuck (ESC). During operation, a substrate 108 is arranged on the substrate support 106. While a specific substrate processing system 100 and processing chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber 102. A base portion is generally cylindrical and extends radially outwardly from an opposite end of the stem portion at a location that is spaced from the top surface of the processing chamber 102. A substrate-facing surface or faceplate of the base portion of the showerhead 109 includes holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a top plate 112, which may be formed of ceramic. In some examples, the top plate 112 may include one or more heating layers, such as a ceramic multi-zone heating plate. The one or more heating layers may include one or more heating elements, such as conductive traces, as further described below.

A bond layer 114 is disposed between and bonds the top plate 112 to the baseplate 110. The baseplate 110 may include one or more coolant channels 116 for flowing coolant through the baseplate 110. In some examples, the substrate support 106 may include an edge ring 118 arranged to surround an outer perimeter of the substrate 108.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the baseplate 110. In other examples, the RF voltage is provided to the upper electrode 104. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, ..., and 132-N (referred to collectively as gas sources 132), where N is an integer greater than zero. The gas sources supply one or more gas mixtures. The gas sources may also supply purge gas. Vaporized precursor may also be used. The gas sources 132 are connected by valves 134-1, 134-2, ..., and 134-N (referred to collectively as valves 134) and mass flow controllers 136-1, 136-2, ..., and 136-N (referred to collectively as mass flow controllers 136) to a manifold 140. An output of the manifold 140 is fed to the processing chamber 102. For example only, the output of the manifold 140 is fed to the showerhead 109.

A temperature controller 142 may be connected to heating elements, such as thermal control elements (TCEs) 144 arranged in the top plate 112. For example, the heating elements may include, but are not limited to, macro heating elements corresponding to respective zones in a multi-zone heating plate and/or an array of micro heating elements disposed across multiple zones of a multi-zone heating plate. The temperature controller 142 may be used to control the heating elements to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. The system controller 160 may include and/or communicate with memory 162, which may include volatile memory, non-volatile memory, or combinations thereof. One or more robots 170 may be used to deliver substrates onto, and remove substrates from, the substrate support 106. For example, the robots 170 may transfer substrates between an equipment front end module (EFEM) 171 and a load lock 172, between the load lock and a vacuum transfer module (VTM) 173, between the VTM 173 and the substrate support 106, etc. Although shown as separate controllers, the temperature controller 142 may be implemented within the system controller 160. In some examples, a protective seal 176 may be provided around a perimeter of the bond layer 114 between the top plate 112 and the baseplate 110.

The processing chamber 102 according to the present disclosure includes an emitter 180 arranged to transmit a light signal such as a laser through the processing chamber 102 and through an effective gap between the substrate 108 and the showerhead 109. A receiver (e.g., a sensor) 182 is arranged on a side of the processing chamber 102 opposite the emitter 180 to receive the light signal. A width of the effective gap and, correspondingly, the thickness of the substrate, can be calculated based on characteristics of the light signal as measured by the receiver 182 as described below in more detail.

Figure 2:
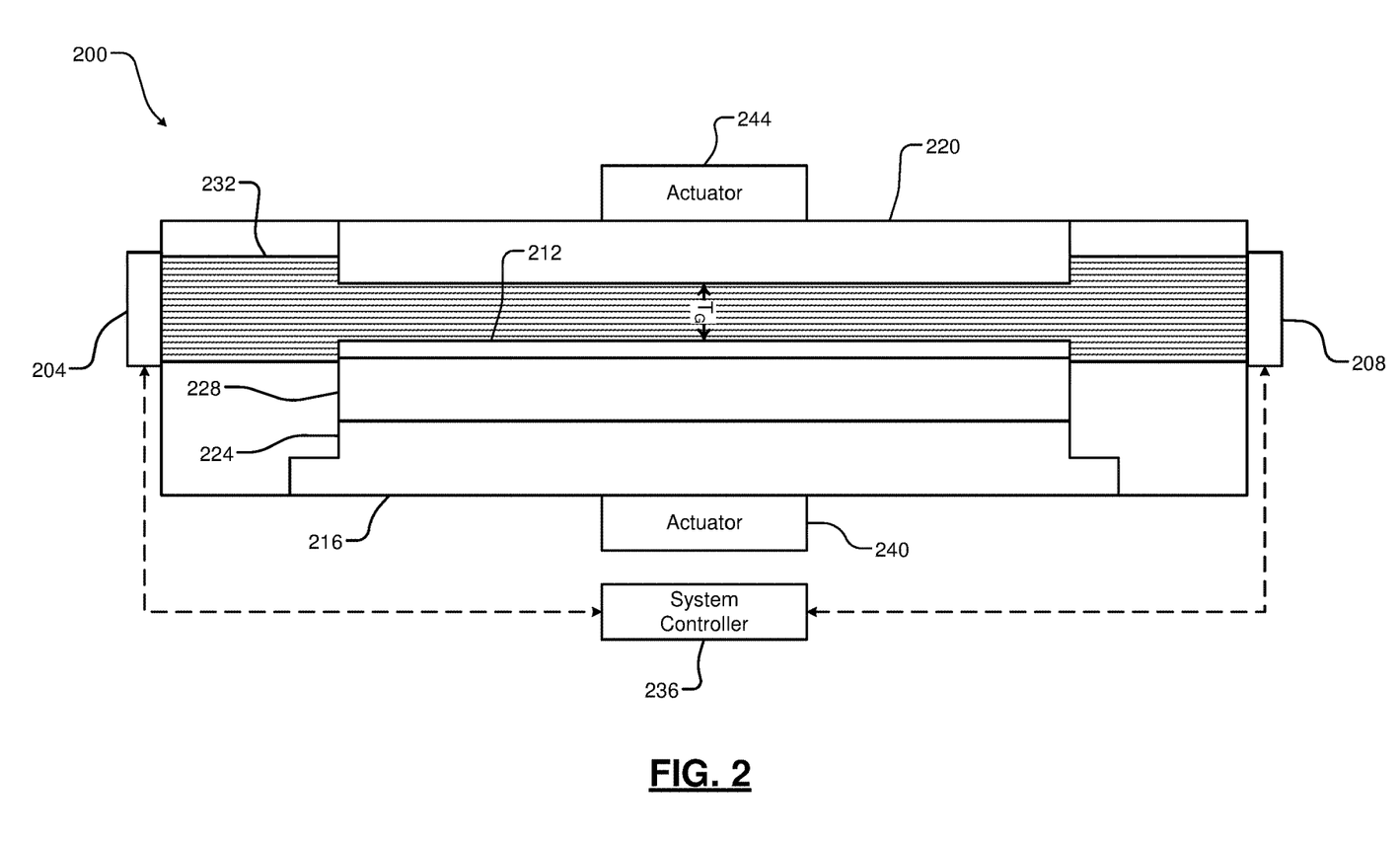
FIG. 2 is an example processing chamber including an emitter and a receiver arranged to measure substrate thickness according the present disclosure.

FIG. 2 shows an example processing chamber 200 including an emitter 204 and a receiver 208 according the present disclosure. For example, the emitter 204 and the receiver 208 are arranged on opposite sidewalls of the processing chamber 200. A substrate 212 is arranged on a substrate support 216 below a component such as a showerhead 220 (as shown), a central insulator, etc. For example, the substrate support 216 includes a baseplate 224 and an upper plate or layer (e.g., a ceramic layer) 228 and the substrate 212 is arranged on the upper plate 228. An effective gap $T_G$ (e.g., a width of the gap) is defined between a lower surface of the showerhead 220 and the substrate 212.

In this example, the emitter 204 is configured to transmit a signal (e.g., a laser or other suitable light signal) 232 through the effective gap between the substrate 212 and the showerhead 220 toward the receiver 208. For example, the emitter 204 is configured to transmit the light signal 232 responsive to control signals generated by a system controller 236. In some examples, the light signal 232 is transmitted while plasma is present in the processing chamber 200.

The receiver 208 senses/receives the light signal 232 and provides a signal to the system controller 236 indicative of characteristics of the light signal 232. For example, the signal provided to the system controller 236 may be indicative of a beam intensity of the light signal 232 as measured by the receiver 208. The system controller 236 is configured to calculate a thickness of the substrate 212 and/or a width of the effective gap based on the measured characteristics of the light signal 232. Although the beam intensity is provided as one example, other characteristics of the light signal 232 that may be measured with a suitable sensor include, but are not limited to, beam energy, beam width, etc.

For example only, the beam intensity of the light signal 232 may depend upon a thickness of the light signal 232 that is permitted to pass through the effective gap. In other words, if the substrate 212 is thicker or the effective gap is otherwise reduced (e.g., due to manufacturing tolerances of the showerhead 220, the baseplate 224, the upper plate 228, etc., contraction and expansion of components over time, component wear, etc.), less of the light signal 232 will be able to pass through the gap toward the receiver 208. Conversely, if the substrate 212 is thinner or the effective gap is otherwise increased, more of the light signal 232 will be able to pass through the gap. Accordingly, a laser intensity I has a proportional relationship with the gap $T_G$ and an inversely proportional relationship with a substrate thickness.

A signal transmitted from the receiver 208 to the system controller 236 is proportional to the measured laser intensity. For example, the receiver 208 may be configured to generate a measurement signal having a voltage indicative of the laser intensity. The system controller 236 is configured to calculate the effective gap and/or the substrate thickness based on the measured laser intensity. In some examples, the system controller 236 may store data in memory (e.g., the memory 162), such as calibration data stored in a lookup table, that correlates laser intensity to known gaps and/or substrate thicknesses. The data may include an initial, calibrated gap value and corresponding laser intensity measured during manufacturing, servicing, etc. Calibration data may include laser intensity measurements for a nominal (e.g., ideal) gap with and without a substrate (e.g., a substrate having a known nominal or expected thickness) present.

The system controller 236 is configured to adjust process parameters (i.e., to compensate for differences between the effective gap and an ideal gap) and/or, in some examples, positions of components of the processing chamber 200 based on the calculated gap. For example, deposition rates may correspond to gap and substrate thickness. More specifically, deposition rates may decrease in some portions of a substrate (e.g., as indicated by substrate radius) as the gap decreases and increase as the gap increases. In other words, deposition rates may be proportional to gap width and inversely proportional to substrate thickness. For example only, a deposition rate for a first substrate thickness and corresponding first gap may be less than a deposition rate for a second substrate thickness and corresponding second gap, where the first substrate thickness is greater than the first substrate thickness and the first gap is less than the second gap. Although described with respect to deposition rates, the principles of the present disclosure may also be applied to etch rates.

Figure 3:
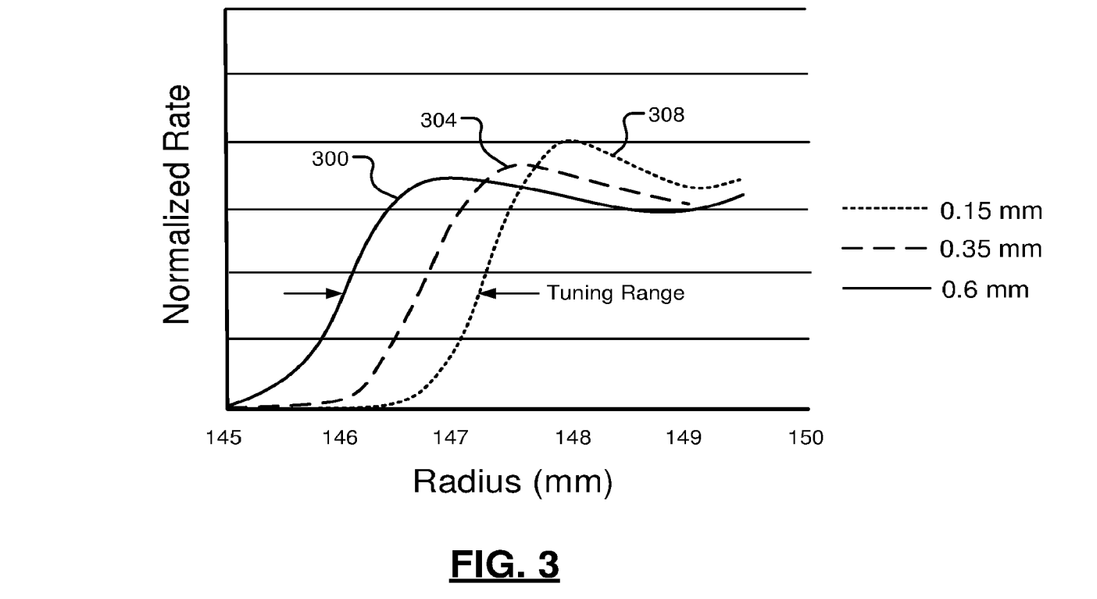
FIG. 3 is a graph showing example deposition rates for different effective gaps according to the present disclosure.

FIG. 3 shows normalized deposition rates relative to substrate radius (e.g., at an outer edge of a substrate having a 150 mm radius) for different effective gaps according to the present disclosure. For example, a deposition rate 300 corresponds to a first effective gap (e.g., 0.6 mm), a deposition rate 304 corresponds to a second effective gap (0.35 mm), and a deposition rate 308 corresponds to a third effective gap (0.15 mm). For example only, as shown, decreasing the effective gap causes the deposition rate to begin increasing at a greater radius, but increases an overall amount the deposition rate increases. In other words, the deposition rate 300 with the first effective gap begins increasing at a smaller radius than the deposition rate 308 for the third effective gap, but the deposition rate 308 nearer the edge of the substrate is greater than the deposition rate 300. In this manner, deposition rates at an edge of the substrate can be tuned in accordance with the effective gap (e.g., in accordance with an available tuning range defined by a range of possible effective gaps and/or substrate thicknesses).

Accordingly, the system controller 236 may adjust process parameters (e.g., flow rates of process gases, plasma RF power, etc.) to selectively increase and decrease deposition rates based on the calculated gap/substrate thickness. For example, the system controller 236 may store data directly correlating deposition rates and/or desired process parameters to values (e.g., voltages) of the measured signal as transmitted by the receiver 208. The data may include a table that indexes the deposition rates to values of the measured signal and a corresponding substrate thickness and/or gap.

In some examples, a height of the showerhead 220 and/or the substrate support 216 may be adjustable using associated actuators. For example, an actuator 240 may be controlled to raise and lower the substrate support 216 while an actuator 244 may be used to raise and lower the showerhead 220. In these examples, instead of and/or in addition to adjusting process parameters, the system controller 236 may selectively raise and lower the showerhead 220 and/or the substrate support 216 to adjust the width of the gap.

Figure 4:
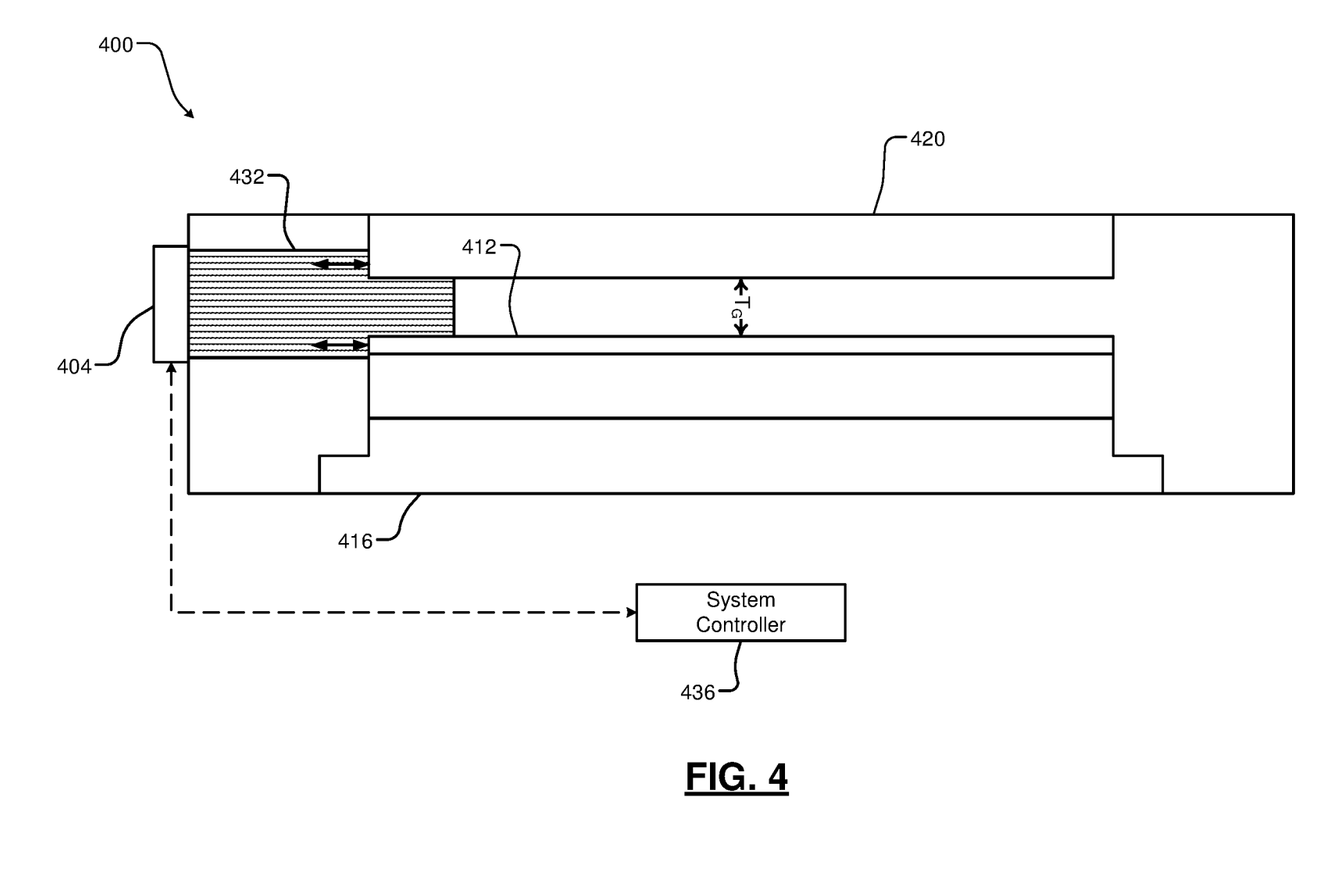
FIG. 4 is another example processing chamber including an emitter/receiver arranged to measure substrate thickness according the present disclosure.

FIG. 4 shows another example processing chamber 400 according to the present disclosure. In this example, the processing chamber 400 includes a combination emitter/receiver 404. A substrate 412 is arranged on a substrate support 416 below a showerhead 420. An effective gap $T_G$ is defined between a lower surface of the showerhead 420 and the substrate 412.

In this example, the emitter/receiver 404 is configured to transmit a signal such as a laser or other light signal 432 toward the effective gap between the substrate 412 and the showerhead 420. For example, the emitter/receiver 404 is configure to transmit the light signal 432 responsive to control signals generated by a system controller 436. In contrast to the example shown in FIG. 2, the emitter/receiver 404 receives a portion of the light signal 432 that is reflected off of the showerhead 420 and the substrate 412 and provides a signal to the system controller 436 indicative of characteristics of the light signal 432 as reflected. For example, the signal provided to the system controller 436 may be indicative of a beam intensity of the portion of the light signal 432 that is reflected and received by the emitter/receiver 404. The system controller 436 is configured to calculate a thickness of the substrate 412 and/or a width of the effective gap based on the measured characteristics of the light signal 432.

For example only, the beam intensity of the light signal 232 depends upon an amount of the light signal 432 that is reflected and does not pass through the effective gap. In other words, if the substrate 412 is thicker or the effective gap is otherwise reduced (e.g., due to manufacturing tolerances of the showerhead 420, substrate support 416, etc., contraction and expansion of components over time, component wear, etc.), less of the light signal 432 will be able to pass through the gap and more of the light signal 432 will be reflected back toward the emitter/receiver 404. Conversely, if the substrate 412 is thinner or the effective gap is otherwise increased, more of the light signal 432 will be able to pass through the gap and less of the light signal 432 will be reflected back toward the emitter/receiver 404.

Accordingly, in this example, a laser intensity I has an inversely proportional relationship with the gap $T_G$ and a proportional relationship with a substrate thickness $T_S$. The system controller 436 is configured to calculate the effective gap and/or the substrate thickness based on the measured laser intensity in a manner similar to that described in FIG. 2.

Although described with respect to substrate thickness and effective gap, the emitter 204 and receiver 208 and/or the emitter/receiver 404 may also be used to determine and adjust other characteristics of a processing chamber. For example, the characteristics of the light signal 232/432 may also be indicative of dimensions of other mechanical components including, but not limited to, a showerhead, upper electrode, or other component arranged above the substrate support, an upper plate of the substrate support, and edge ring, etc. Component thickness may vary due to component contraction and expansion, wear, machining tolerance, etc. The light signal 232/432 may also be indicative of component placement (e.g., placement of an edge ring or other component, height of a moveable edge ring, etc.). In still other examples, the light signal 232/432 may be used to determine the placement of the substrate. For example, the measured characteristic of the light signal 232/432 may vary based on whether the substrate is in a desired centered position.

Figure 5:
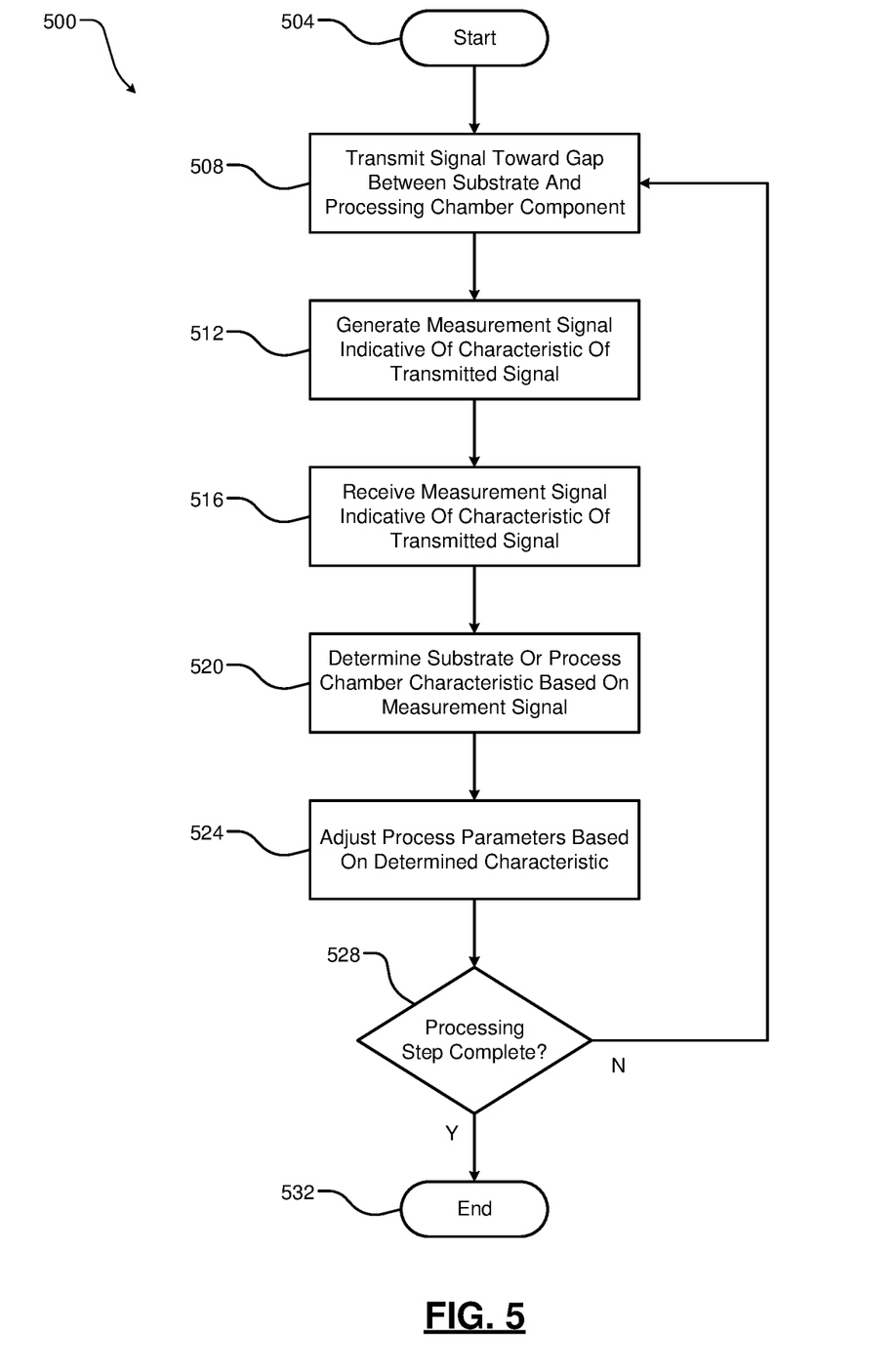
FIG. 5 illustrates steps of an example method 500 for determining substrate thickness according to the present disclosure.

Referring now to FIG. 5, an example method 500 for determining substrate thickness (and/or an effective gap) and adjusting processing parameters accordingly begins at 504. At 508, the method 500 (e.g., the emitter 204, the emitter/receiver 404, etc.) transmits a signal such as a laser or other light signal toward a gap between a substrate and a component arranged above the substrate. At 512, the method 500 (e.g., the receiver 208, the emitter/receiver 404, etc.) generates a measurement signal indicative of a characteristic of the transmitted signal as received, either passing through the gap toward the receiver 208 or reflected back toward the emitter/receiver 404. For example, the characteristic includes a beam or laser intensity I and the measurement signal corresponds to a voltage or other value (e.g., current) that increases or decreases in accordance with the laser intensity.

At 516, the method 500 (e.g., the system controller 236) receives the measurement signal indicative of the characteristic of the transmitted signal. For example, the measurement signal may be indicative of the laser intensity. At 520, the method 500 (e.g., the system controller 236) determines a substrate or process chamber characteristic such as substrate thickness, chamber component dimensions, and/or an effective gap based on the measurement signal. For example, the method 500 may determine the substrate thickness based on stored data correlating the voltage or other value of the signal generated by the receiver 208 directly to the substrate thickness and/or the effective gap.

At 524, the method 500 (e.g., the system controller 236) adjusts one or more process and/or processing chamber parameters based on the determined characteristic (e.g., a determined substrate thickness). For example, the method 500 may adjust process parameters associated with deposition to increase or decrease a deposition rate based on the determined substrate thickness. In some examples the method 500 may adjust the process parameters based on stored data directly correlating the voltage or other value to adjustments to process parameters, offsets from process parameters, etc.

At 528, the method 500 (e.g., the system controller 236) determines whether a processing step (e.g., a deposition step) is complete. If true, the method 500 ends at 532. If false, the method 500 continues to 508.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for controlling processing of a substrate arranged in a processing chamber, the system comprising:
   an emitter configured to transmit a signal toward a gap between the substrate and a component of the processing chamber arranged above the substrate;
   a receiver configured to receive at least a portion of the transmitted signal and generate a measurement signal based on a characteristic of the received portion of the transmitted signal,
   wherein either i) the emitter and the receiver are arranged on opposite sidewalls of the processing chamber and the received portion of the transmitted signal passes through the gap to be received by the receiver, or ii) the emitter and the receiver are arranged on a same sidewall of the processing chamber and a non-received portion of the transmitted signal passes through the gap and the received portion of the transmitted signal is reflected off of at least one of the substrate and the component and back toward the receiver to be received by the receiver; and
   a system controller configured to receive the measurement signal and selectively adjust a parameter of the processing chamber based on a relationship between values of the measurement signal and at least one of (i) a thickness of the substrate, (ii) a width of the gap between the substrate and the component of the processing chamber, and (iii) an amount to adjust the parameter of the processing chamber.

2. The system of claim 1, wherein the transmitted signal is a laser and the characteristic is a beam intensity of the laser.

3. The system of claim 2, wherein the emitter and the receiver are arranged on the opposite sidewalls of the processing chamber and the beam intensity of the laser corresponds to a portion of the laser that passes through the gap to be received by the receiver.

4. The system of claim 3, wherein the system controller is configured to i) determine the width of the gap based on the measurement signal, and ii) adjust the width of the gap based on the determined width.

5. The system of claim 4, wherein the system comprises only a single emitter and a single receiver for determining the width of the gap, the single emitter being the emitter emitting the signal transmitted towards the gap, and the single receiver being the receiver receiving the received portion of the transmitted signal.

6. The system of claim 4, wherein the system controller is configured to move at least one of the component and a substrate support to adjust the width of the gap.

7. The system of claim 6, wherein the component is a showerhead.

8. The system of claim 3, wherein the system controller is configured to i) determine the thickness of the substrate, and ii) adjust the width of the gap based on the determined thickness.

9. The system of claim 8, wherein the system comprises only a single emitter and a single receiver for determining the thickness of the substrate, the single emitter being the emitter emitting the signal transmitted towards the gap, and the single receiver being the receiver receiving the received portion of the transmitted signal.

10. The system of claim 2, wherein a combination emitter/receiver comprises the emitter and the receiver and the beam intensity of the laser corresponds to a portion of the laser reflected off of at least one of the substrate and the component and back toward the combination emitter/receiver.

11. The system of claim 10, wherein the system controller is configured to i) determine the width of the gap based on the measurement signal, and ii) adjust the width of the gap based on the determined width.

12. The system of claim 11, wherein the system comprises only a single emitter and a single receiver for determining the width of the gap, the single emitter being the emitter emitting the signal transmitted towards the gap, and the single receiver being the receiver receiving the received portion of the transmitted signal.

13. The system of claim 11, wherein the system controller is configured to move at least one of the component and a substrate support to adjust the width of the gap.

14. The system of claim 13, wherein the component is a showerhead.

15. The system of claim 10, wherein the system controller is configured to i) determine the thickness of the substrate, and ii) adjust the width of the gap based on the determined thickness.

16. The system of claim 15, wherein the system comprises only a single emitter and a single receiver for determining the thickness of the substrate, the single emitter being the emitter emitting the signal transmitted towards the gap, and the single receiver being the receiver receiving the received portion of the transmitted signal.

17. The system of claim 2, wherein the values of the measurement signal include one of voltage values and current values indicative of the beam intensity.

18. The system of claim 1, wherein the system controller is configured to calculate at least one of the thickness of the substrate and the width of the gap based on the values of the measurement signal.

19. The system of claim 18, wherein the system controller is configured to calculate the amount to adjust the parameter based on the at least one of the thickness of the substrate and the width of the gap.

20. The system of claim 1, wherein the system controller is configured to determine at least one of the thickness of the substrate and the width of the gap based on stored data correlating the values of the measurement signal to the at least one of the thickness of the substrate and the width of the gap.

21. The system of claim 1, wherein the system controller is configured to determine the amount to adjust the parameter based on stored data correlating the values of the measurement signal to the amount to adjust the parameter.

22. The system of claim 1, wherein the parameter corresponds to at least one of a deposition rate and an etch rate and the system controller is configured to adjust the at least one of the deposition rate and the etch rate based on the values of the measurement signal.

23. The system of claim 1, wherein the system controller is configured to i) determine the width of the gap based on the measurement signal, and ii) adjust the width of the gap based on the determined width and a target width.

24. The system of claim 23, wherein the system controller is configured to move at least one of the component and a substrate support to adjust the width of the gap.

25. The system of claim 24, wherein the component is a showerhead.

26. The system of claim 1, wherein the system comprises only a single emitter and a single receiver based on which the parameter is adjusted, the single emitter being the emitter emitting the signal transmitted towards the gap, and the single receiver being the receiver receiving the received portion of the transmitted signal.

27. The system of claim 1, wherein the system controller is configured to i) determine the thickness of the substrate, and ii) adjust the width of the gap based on the determined thickness.

28. The system of claim 1, wherein there is no intermediary component disposed between the substrate and the component of the processing chamber.

29. The system of claim 1, wherein the width of the gap is defined by surfaces of the substrate and the component.

30. The system of claim 1, wherein the width of the gap is a distance between the substrate and the component.

31. The system of claim 1, wherein the system controller is configured to adjust the parameter to compensate for a difference between the width of the gap and an ideal width of the gap.

32. A method for controlling processing of a substrate arranged in a processing chamber, the method comprising:
transmitting, using an emitter, a signal toward a gap between the substrate and a component of the processing chamber arranged above the substrate;
receiving, using a receiver, at least a portion of the transmitted signal and generating a measurement signal based on a characteristic of the received portion of the transmitted signal,
wherein either i) the emitter and the receiver are arranged on opposite sidewalls of the processing chamber and the received portion of the transmitted signal passes through the gap to be received by the receiver, or ii) the emitter and the receiver are arranged on a same sidewall of the processing chamber and a non-received portion of the transmitted signal passes through the gap and the received portion of the transmitted signal is reflected off of at least one of the substrate and the component and back toward the receiver to be received by the receiver; and
selectively adjusting a parameter of the processing chamber based on a relationship between values of the measurement signal and at least one of (i) a thickness of the substrate, (ii) a width of the gap between the substrate and the component of the processing chamber, and (iii) an amount to adjust the parameter of the processing chamber.

33. The method of claim 32, wherein the transmitted signal is a laser and the characteristic is a beam intensity of the laser.

34. The method of claim 33, wherein the emitter and the receiver are arranged on the opposite sidewalls of the processing chamber and the beam intensity of the laser corresponds to a portion of the laser that passes through the gap to be received by the receiver.

35. The method of claim 33, wherein a combination emitter/receiver comprises the emitter and the receiver and the beam intensity of the laser corresponds to a portion of the laser reflected off of at least one of the substrate and the component and back toward the combination emitter/receiver.

36. The method of claim 33, wherein the values of the measurement signal include one of voltage values and current values indicative of the beam intensity.

37. The method of claim 32, further comprising calculating at least one of the thickness of the substrate and the width of the gap based on the values of the measurement signal.

38. The method of claim 37, further comprising calculating the amount to adjust the parameter based on the at least one of the thickness of the substrate and the width of the gap.

39. The method of claim 32, further comprising determining at least one of the thickness of the substrate and the width of the gap based on stored data correlating the values of the measurement signal to the at least one of the thickness of the substrate and the width of the gap.

40. The method of claim 32, further comprising determining the amount to adjust the parameter based on stored data correlating the values of the measurement signal to the amount to adjust the parameter.

41. The method of claim 32, wherein the parameter corresponds to at least one of a deposition rate and an etch rate and further comprising adjusting the at least one of the deposition rate and the etch rate based on the values of the measurement signal.

* * * * *